United States Patent [19]

Hirose

[11] Patent Number: 5,625,597

[45] Date of Patent: Apr. 29, 1997

[54] DRAM HAVING TEST CIRCUIT CAPABLE OF PERFORMING FUNCTION TEST OF REFRESH COUNTER AND MEASUREMENT OF REFRESH CYCLE SIMULTANEOUSLY

[75] Inventor: Yoshihiko Hirose, Tokyo, Japan

[73] Assignee: Kabushiki Kaisha Toshiba, Kawasaki, Japan

[21] Appl. No.: 627,126

[22] Filed: Apr. 3, 1996

[30] Foreign Application Priority Data

Apr. 4, 1995 [JP] Japan ................................. 7-078826

[51] Int. Cl.⁶ .................................................. G11C 29/00
[52] U.S. Cl. ......................... 365/201; 365/222; 365/203
[58] Field of Search .................................. 365/201, 222, 365/202, 203, 236, 190

[56] References Cited

U.S. PATENT DOCUMENTS

| 4,347,589 | 8/1982 | Proebsting | 365/222 |
| 4,807,196 | 2/1989 | Mizukami | 365/222 |
| 5,321,661 | 6/1994 | Iwakiri et al. | 365/222 |
| 5,418,754 | 5/1995 | Sakakibara | 365/222 |
| 5,450,364 | 9/1995 | Stephens, Jr. et al. | 365/222 |
| 5,471,430 | 11/1995 | Sawada et al. | 365/222 |
| 5,502,677 | 3/1996 | Takahashi | 365/201 |

*Primary Examiner*—Tan T. Nguyen
*Attorney, Agent, or Firm*—Foley & Lardner

[57] ABSTRACT

According to the present invention, there is provided a circuit structure capable of carrying out the function test of the refresh counter and the measurement of the counter cycle at the time of the refresh operation. The counter generates a refresh row address. The bit line sense amplifier circuit connected to a bit line pair for transmitting data of a memory cell, consists of the N-channel sense amplifier and the P-channel sense amplifier. The sense amplifier driving circuit supplies respective driving signals for the N-channel sense amplifier and the P-channel sense amplifier. The test control circuit is provided for carrying out the function test of the refresh counter and the measurement of the counter cycle at the time of the refresh operation, and controls the driving signals so as to set one of the N-channel sense amplifier and the P-channel sense amplifier in a non-active state at the time of a test mode.

9 Claims, 3 Drawing Sheets

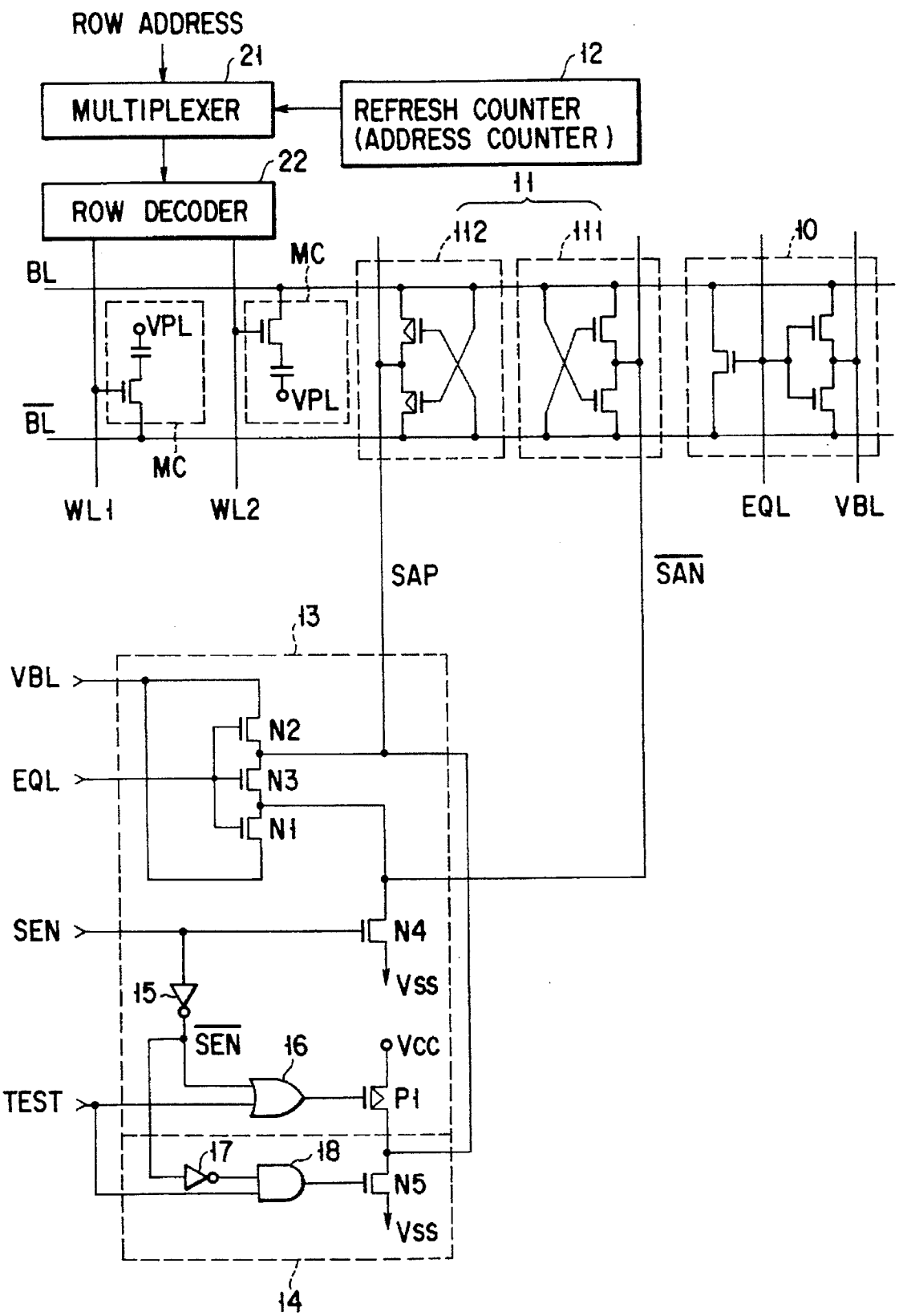
F I G. 1

|  | NORMAL OPERATION MODE | | TEST MODE | |
|---|---|---|---|---|
|  | STANDBY | ACTIVE | STANDBY | ACTIVE |
| TEST | L | | H | |
| WLi | L | VWL | L | VWL |
| SEN | L | H | L | H |
| SAP | VBL | H | VBL | L |
| $\overline{SAN}$ | VBL | L | VBL | L |
| EQL | H | L | H | L |
| BL | VBL | L/H | VBL | L |
| $\overline{BL}$ | VBL | H/L | VBL | L |

H = VCC
L = VSS
VBL = VCC/2
VWL > VCC

FIG. 2

|  | NORMAL OPERATION MODE | | TEST MODE | |
|---|---|---|---|---|
|  | STANDBY | ACTIVE | STANDBY | ACTIVE |
| TEST | L | | H | |
| WLi | L | VWL | L | VWL |
| SEN | L | H | L | H |
| SAP | VBL | H | VBL | H |
| $\overline{SAN}$ | VBL | L | VBL | H |
| EQL | H | L | H | L |
| BL | VBL | L/H | VBL | H |
| $\overline{BL}$ | VBL | H/L | VBL | H |

H = VCC
L = VSS
VBL = VCC/2
VWL > VCC

FIG. 4

DRAM HAVING TEST CIRCUIT CAPABLE OF PERFORMING FUNCTION TEST OF REFRESH COUNTER AND MEASUREMENT OF REFRESH CYCLE SIMULTANEOUSLY

BACKGROUND OF THE INVENTION

1. Field of the Invention

The present invention relates to a semiconductor memory device and a testing method thereof, and more specifically to a dynamic semiconductor memory (DRAM) having refresh modes such as a self refresh and an auto-refresh in particular, which has a control circuit for carrying out a function test of-an internal counter for refresh (refresh counter) built in for generating a row address for a refreshing operation, and a measurement of a counter cycle (refresh interval) at the time of refresh, and a testing method for the DRAM.

2. Description of the Related Art

In many cases, the inspection of DRAM devices, which is carried out during the course of the production or after the product is completed, includes an operation test of its refresh counter (counter test). The refresh counter is incremented the row address so as to restore (refresh) the charge on a memory cell DRAM. The refresh operation can be generally divided into an auto-refresh and a self-refresh. In the auto-refresh operation, the refresh cycle is controlled by a signal from outside, whereas in the self-refresh mode, the refresh cycle is controlled by an internal signal. The self-refresh operation is used at the time of the battery back-up of the DRAM device, and the standby of the device.

In a conventional DRAM device, there is provided a test circuit exclusively for testing whether or not the switching of address is appropriately carried out at the time of a refresh operation, by incrementing an output signal (row address) of the refresh counter. Such an exclusive test circuit occupies a large area in the device and causes an increase in the production cost.

The operation test for the refresh counter can be replaced of an operation test of the self refresh mode of the DRAM, even without the above-described exclusive test circuit. First, in the normal operation mode, data "1" (cell level= "H") is written in a memory cell of the DRAM. Next, the operation is switched into the self-refresh mode. Then, the operation waits for a time period sufficiently longer than the pause time of the memory cell which is the object of the measurement, that is, the self-refresh operation is being continued. Next, the data of the memory cell is read out and examined as to whether or not the data is the same as the data written in advance (whether or not the data is broken). The operation test of the self-refresh mode requires a time period sufficiently longer than the pause time of the memory cell as described above. Such a time period is usually longer than the refresh time period of the DRAM, and is as long as a few seconds in total. Thus, the conventional device involves an increase in test requiring time, and causes an increase in test cost and, accordingly a production cost.

Meanwhile, in a self-refresh mode, the cycle of the refresh counter is determined automatically by the internal clock, and therefore the accurate cycle of the counter cannot be known from outside. For example, in some of the PSRAMs (pseudo-static RAMs) having self-refresh modes, a test circuit exclusively for testing a pulse output from a particular input/output pins in accordance with the counter cycle, is provided so as to measure the cycle of the refresh counter at the time of the self-refresh operation, that is, refresh interval. However, if such an exclusive test circuit for measuring a refresh interval is provided, the size of a chip is increased, causing an increase in chip cost and production cost. Further, a chip including the exclusive test circuit, has a structure in which an excessive load is inevitably applied to a particular input/output pin, and therefore a high-speed operation device, especially, such as a recent synchronous type DRAM is adversely affected in terms of output waveform.

SUMMARY OF THE INVENTION

The present invention has been provided in order to solve the above-described drawbacks of the conventional technique, and the object thereof is to provide a dynamic type semiconductor memory capable of carrying out the function test of the refresh counter and the measurement of the counter cycle at the time of a self-refresh accurately in a short period of time by the same test circuit, and the testing method thereof.

The above object of the present invention can be achieved by a typical structure and a testing method, which will be described below.

That is, a dynamic semiconductor memory device comprising:

a counter for generating a row address for carrying out a refresh operation in accordance with an auto-refresh mode and a self-refresh mode; memory cells arranged in matrix, word lines connected to memory cells located in a same column; bit lines connected to memory cells in a same row, the bit lines being provided in pair to be complimentary to each other; a precharge equalizing circuit connected to the complimentary bit line pair; a bit line sense amplifying circuit including a first conductivity type sense amplifier and a second conductivity type sense amplifier, connected to the bit line pair; a sense amplifier driving circuit for supplying respective driving signals of the first conductivity type sense amplifier and the second conductivity type sense amplifier; and a test control circuit for controlling an operation of the sense amplifier driving circuit, in order to carry out the function test of the counter and the measurement of the counter cycle at the time of the refresh operation, the test control circuit controlling the driving signals so as to set one of the first conductivity type sense amplifier and the second conductivity type sense amplifier in a non-active state at the time of a test mode.

According to the testing method having the above-described structure, in the normal operation mode, data having a predetermined level are written in all the memory cells of at least one row, and then in the refresh mode, the test control circuit is operated so as to write data invert to those having the predetermined level into the memory cells. Subsequently, the normal operation mode is recovered, the data are successively read out from the memory cells, and compared with the data written before the refresh mode. If the data have been converted into the invert data to those written before the refresh mode, it is judged to be "fail", whereas if not, it is judged to be "pass". Thus, the number of operations of the refresh counter can be known from the fail bit number detected. In the case of the auto-refresh operation, the number of executions of the auto-refresh operation is equal to the fail bit number detected, whereas in the case of the self-refresh operation, the number of executions of the refresh operation is equal to the fail bit number. The cycle of the refresh counter can be calculated by dividing the operation time period of the test control circuit by the fail bit number.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a circuit diagram showing the main portion of a DRAM having a refresh mode, according to the first embodiment of the present invention;

FIG. 2 is a table summarizing statuses of each of signals when the standby state is shifted to the active state in the normal operation mode and the test mode of the DRAM shown in FIG. 1;

FIG. 4 is a table summarizing statuses of each of signals when the standby state is shifted to the active state in the normal operation mode and the test mode of the DRAM shown in FIG. 3.

DETAILED DESCRIPTION OF THE PREFERRED EMBODIMENTS

Figure 3:
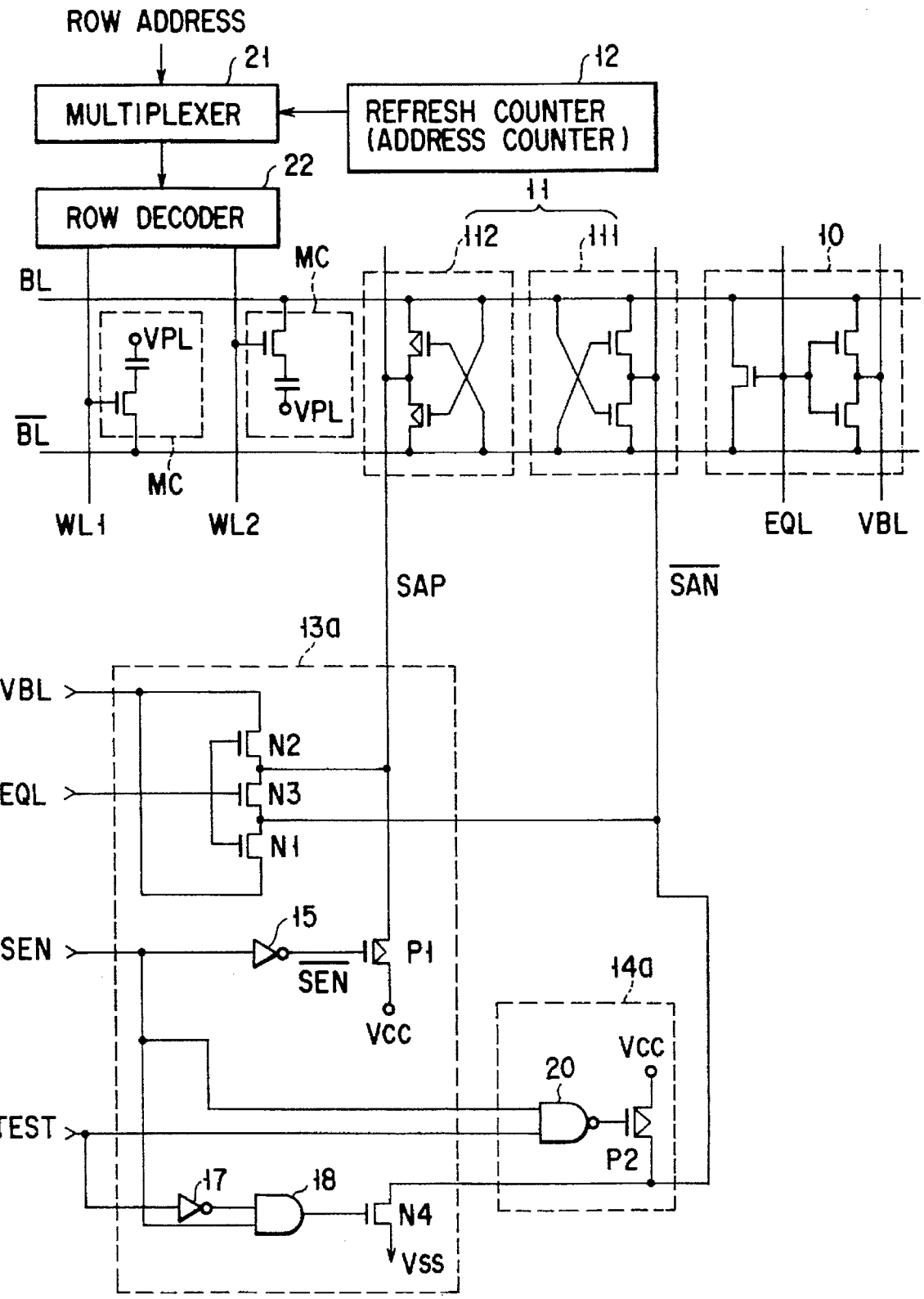
FIG. 3 is a circuit diagram showing the main portion of a DRAM having a refresh mode, according to the second embodiment of the present invention.

FIG. 1 illustrates the main portion of a DRAM having a self-refresh mode and an auto-refresh mode, according to the first embodiment of the present invention. In FIG. 1, a symbol MC denotes a memory cell. There are a plurality of memory cells arranged in matrix, and the figure shows a portion of one column. WLi (i=1, 2, . . . ) are word lines connected respectively to memory cells in the same column, and BL and $\overline{BL}$ bit lines connected to memory cells in the same column (only one pair is shown in the figure). A precharge equalizing circuit 10 is connected to complimentary bit line pair BL and $\overline{BL}$, and is controlled by an equalizing signal EQL, so as to set the bit line pair BL and $\overline{BL}$ at a precharge voltage VBL (usually one half of power potential Vcc). The sense amplifier 11 is connected to complimentary bit line pair BL and $\overline{BL}$, includes the first conductivity type sense amplifier and the second conductivity type sense amplifier (an N channel sense amplifier 111 for detecting difference between bit lines in potential and a P channel sense amplifier 112 for restoring a bit line potential in this embodiment). The refresh counter 12 is provided so as to generate a refresh row address at the time of a refresh mode of the DRAM. An output signal of the refresh counter and an ordinary address signal are switched by a multiplexer 21, and given to a row decoder 22. In accordance with the output signal from the row decoder 22, the voltage of the word line WLi is selectively controlled.

A sense amplifier driving circuit 13 is designed to supply a driving signal $\overline{SAN}$ of the N channel sense amplifier 111 and a driving signal SAP of the P channel sense amplifier 112 on the basis of the bit line precharge voltage VBL, the equalizing signal EQL and a sense amplifier enable signal SEN. The sense amplifier driving circuit 13 includes first and second NMOS transistors N1 and N2, a bit line precharge voltage VBL being applied to an end of each transistor, and the equalizing signal EQL being supplied to a gate of each transistor; a third NMOS transistor N3, inserted between the other ends of the two NMOS transistors, for supplying the equalizing signal EQL; a fourth NMOS transistor N4, connected between the point of connection of the first and third NMOS transistors in series (the output node of a sense amplifier driving signal $\overline{SAN}$) and a Vss node (ground potential node), and controlled to be in an ON state when the normal operation mode is "active" or the test mode is "active"; and a PMOS transistor P1, connected between the point of connection of the second and third NMOS transistors in series (the output node of the sense amplifier driving signal SAP) and a Vcc node, and controlled to be in an ON state when the normal operation mode is "active" and to be in an OFF state when the test mode is "active".

In this embodiment, the sense amplifier driving circuit 13 further includes an OR circuit 16 having two inputs, to which an inversion signal $\overline{SEN}$ obtained by inverting a sense amplifier enable signal SEN by an inverter circuit 15, and a test mode entry signal TEST are input. An output signal of the OR circuit 16 is supplied to the gate of the PMOS transistor P1 and the sense amplifier enable signal SEN is supplied to the gate of the fourth NMOS transistor N4.

The test control circuit 14 is provided so as to control the sense amplifier driving signal SAP used for carrying out the function test of the refresh counter and the counter cycle of the self-refresh, and is designed to pull down the P channel sense amplifier driving signal output of the sense amplifier driving signal to the ground potential at the test mode. More specifically, the test control circuit 14 includes a fifth NMOS transistor N5 connected between the point of connection of the second and third NMOS transistors in series (the output node of a sense amplifier driving signal SAP) and a Vss node, and controlled to be in an ON state when the normal operation mode is "active" or the test mode is "active". In this embodiment, the test control circuit 14 further includes an AND circuit 18 having two inputs, to which the sense amplifier enable signal SEN or a signal having the same phase as that of the signal SEN (in this embodiment, a signal obtained by once again inverting the inversion signal $\overline{SEN}$ by the inverter circuit 17, and the test mode entry signal TEST are input. An output signal of the AND circuit 18 is supplied to the gate of the fifth NMOS transistor N5. In other words, the drain of the NMOS transistor N5 and the P-channel sense amplifier driving signal (SAP) output node of the sense amplifier driving circuit 13 are connected in common.

The operations of the sense amplifier driving circuit 13 and the test controlling circuit 14 in FIG. 1 will now be described. During the normal operation mode, a TEST signal is at an "L" level (=ground potential Vss), an output from the AND circuit 18 is at an "L" level, and the NMOS transistor N4 is in an OFF state. When the sense amplifier enable signal SEN is at the "L" level, the NMOS transistor N4 is in an OFF state, an output $\overline{SEN}$ of the inverter circuit 15 is at an "H" level (=power potential Vcc), an output from the OR circuit 16 is at the "H" level and the PMOS transistor P1 is in an OFF state. Under these circumstances, when the equalizing signal EQL is at the "H" level, each of the first, second and third NMOS transistors N1 to N3 is in the ON state, and the level of each of the sense amplifier driving signals $\overline{SAN}$ and SAP is at VBL.

While the above-described state is maintained, when the sense amplifier enable signal SEN is shifted to the "H" level, the NMOS transistor N4 is turned on, and the sense amplifier driving signal $\overline{SAN}$ output node Vss is pulled down to the potential Vss. Further, an output $\overline{SEN}$ of the inverter circuit 15 is shifted to the "L" level, the output from the OR circuit 16 is shifted to the "L" level, the PMOS transistor P1 is set in the ON state, and the sense amplifier driving signal SAP output node is pulled up to the potential Vcc.

In the meantime, during the test mode, the TEST signal is at the "H" level, the output of the OR circuit 16 is at the "H" level and the PMOS transistor P1 is in the OFF state. Under these circumstances, when the sense amplifier enable signal SEN is at the "L" level, the NMOS transistor N4 is in the OFF state, the output $\overline{SEN}$ of the inverter circuit 15 is at the "H" level, the output of the inverter circuit 17 in the next stage, is at the "L" level, the output of the AND circuit 18 is at the "L" level, and the NMOS transistor N5 is in the OFF state. At this point, when the equalizing signal EQL is at the "H" level, each of the first, second and third NMOS transistors N1 to N3 is in the ON state, and the level of each of the sense amplifier driving signals $\overline{SAN}$ and SAP is at VBL. While the above-described state is maintained, when the sense amplifier enable signal SEN is shifted to the "H" level, the NMOS transistor N4 is turned on, and the sense amplifier driving signal $\overline{SAN}$ output node Vss is pulled down to the potential Vss. Further, an output $\overline{SEN}$ of the inverter circuit 15 is shifted to the "L" level, the output from the inverter circuit 17 in the next stage is shifted to the "H" level, the output of the AND circuit 18 is shifted to the "H" level, and the NMOS transistor N5 is turned on, and the sense amplifier driving signal SAP output node is pulled down to the potential Vss.

FIG. 2 shows the status of each signal when the state is shifted from "standby" to "active" (from the write state to the read state) in the normal operation mode and the test mode of the DRAM shown in FIG. 1. The DRAM device operates in the following manner during the normal operation mode (when the TEST signal is at the "L" level). When the state of the mode is shifted from "standby" to "active", the word line level is raised from "L" to the word line boost potential VWL (>Vcc), and the data of a memory cell is read out on the bit line BL or $\overline{BL}$. After that, the sense amplifier driving signal $\overline{SAN}$ is shifted from VBL to the "L" level, and the sense amplifier driving signal SAP is shifted from VBL to the "H" level (=Vcc). Therefore, the sense amplifier 11 starts to operate, and the level of the bit line BL or $\overline{BL}$ is determined to be "L" or "H" in accordance with the memory cell data. Meanwhile, during the test mode (where the TEST signal is at the "H" level), the DRAM device operates in the following manner. When the state is shifted from "standby" to "active", the sense amplifier driving signal SAP is shifted from VBL to, for example, the "L" level, and the level of each of the bit lines BL and $\overline{BL}$ becomes "L".

Next, an example of the DRAM testing method of performing the function test of the refresh counter 12 using the test mode and the measurement of the counter cycle at the self-refresh mode, will now be described.

(A) The sequence of the function test of the refresh counter 12 is as follows.

(1) In the normal operation mode, the level "H" is written in memory cells in one column (the memory cells in all the rows of that column). During the writing of the data, in a regular DRAM, the input/output level of an input/output pin may not coincide the data level of a memory cell, depending upon the arrangement of the memory cells. In order to correct the data handled within such a system, an ARIRAM (area invert RAM) function usually built in the tester is used. Thus, the input/output level is assigned on the tester side so that the level "H" is written/read at the memory cell level.

(2) The operation is shifted to the test mode, and the auto-refresh operation is carried out on the memory cells in all the rows oS that column. In this case, as described above, the sense amplifier driving signal SAP is shifted from VBL to the "L" level, and therefore the level "L" (data "0") is written in a memory cell on which the refresh operation has been carried out.

(3) The operation is shifted back to the normal operation mode, and the data is read out from the memory cells in all the rows of that column. At the same time, the ARIRAM function is activated. The results of the reading out are compared with expected data ("H" level) in the tester. If the data is at the "L" level, it is judged to be "fail", whereas the data is at the "H" level, it is judged to be "pass".

In the case where the refresh counter 12 appropriately functions, the level "L" is written in the memory cells in all the rows of that column. Therefore, the level "L" is read out from the memory cells in all the rows of that column, in the reading out operation described in the above (3). In the case where the refresh counter 12 malfunctions, there result some rows which are not accessed during the writing operation described in the above (2), and therefore the level "H" is read out from those cells in the reading out operation in the above (3). Thus, it becomes possible to detect a malfunction. In the case where a "fail" is detected, the number of operations of the refresh counter can be obtained from the fail bit number detected.

(B) The sequence of the measurement of the counter cycle (refresh interval Tref) at the self-refresh mode is as follows. In the measurement of the counter cycle, it is essential that the counter function normally functions.

(1) In the normal operation mode, the level "H" is written in memory cells in one column (the memory cells in all the rows of that column). During the writing of the data, the ARIRAM function is activated.

(2) The operation is shifted to the self-refresh mode, and the refresh operation is carried out for a certain period of time (Tpause) while standing by. In this case, as described above, the sense amplifier driving signal SAP is shifted from VBL to the "L" level, and therefore the level "L" (data "0") is written in a memory cell on which the refresh operation has been carried out.

(3) The operation is shifted back to the normal operation mode, and the data is read out from the memory cells in all the rows of that column. At the same time, the ARIRAM function is activated. The results of the reading out are compared with expected data ("H" level) in the tester. If the data is at the "H" level, it is judged to be "pass", whereas the data is at the "L" level, it is judged to be "fail".

In the case where it is judged to be "fail", it is possible to obtain the number of executions of the self-refresh from the fail bit number FB detected. Therefore, the relationship, Tref=Tpause/FB can be established, in other words, the refresh interval Tref can be obtained from the time in which the fail bit varies by 1 bit.

Further, the constant pause time (Tpause) in the operation described in the above (2) is a waiting time until the self-refresh is carried out at least once. The waiting time (Tpause), though it depends upon the type of the DRAM product, is in the order to several tens of µs in the case of a 16M DRAM. As described, since the short pause time (Tpause) is negligibly short, the increase in the time due to the pause time does not substantially matter.

More specifically, with the DRAM according to the first embodiment, it becomes possible to carry out a function test of the refresh counter accurately in a short period of time (without requiring such a long time period as in the conventional technique). Further, the function test of the refresh counter and the measurement of the counter cycle at the time of self-refresh, can be carried out by the same test control circuit. Consequently, an extra test circuit is not required. Therefore, the required time for the test is shortened, and the production cost can be reduced as the test cost is lowered.

The testing method of the present invention is not limited to the embodiment described above. The testing method can be applied to a DRAM device including memory cells arranged in matrix, word lines connected to memory cells located in the same column; bit lines connected to memory cells in the same row; a precharge equalizing circuit connected to the complimentary bit line pair; a bit line sense amplifying circuit including the first conductivity type sense amplifier and the second conductivity type sense amplifier, connected to the bit line pair; a sense amplifier driving circuit for supplying respective driving signals of the first conductivity type sense amplifier and the second conductivity type sense amplifier; an address counter for generating a row address of each of the memory cells; and a row decoder for decoding the row address from the address counter, and selectively drives the word lines. The method includes the first step of writing data of a predetermined level to memory cells of all the rows, the second step of controlling the second conductivity type sense amplifier in a non-active state and only the first conductivity type sense amplifier is an active state, and consecutively selecting all the word lines, and the third step of consecutively reading out data of the memory cell on all the rows, wherein whether or not there is an erroneous operation of the address counter is detected from the comparison between the write data in the first step and the read data in the third step, and in the case where an erroneous operation is detected, the cycle of the counting operation of the address counter is obtained from the bit number in accordance with necessity.

FIG. 3 is a diagram showing the main portion of the DRAM having a self-refresh mode and an auto-refresh mode, according to the second embodiment of the present invention. The DRAM of the second embodiment is similar to that of the first embodiment except for the structure of each of the sense amplifier driving circuit 13a and the test control circuit 14a, and the same members are designated by the same reference numerals.

The sense amplifier driving circuit 13a includes the fourth NMOS transistor N4, connected between the point of connection of the first and third NMOS transistors in series (the output node of an N-channel sense amplifier driving signal) and a ground potential node, and controlled to be in an ON state when the normal operation mode is "active" or to be in an OFF state when the test mode is "active"; and the first PMOS transistor P1, connected between the point of connection of the second and third NMOS transistors in series (the output node of the P-channel sense amplifier driving signal) and a Vcc node, and controlled to be in an ON state when the normal operation mode is "active" or when the test mode is "active".

According to this embodiment, in the sense amplifier driving circuit 13a, a sense amplifier enable signal SEN and an inversion signal $\overline{TEST}$ obtained by inverting a test mode entry signal TEST by an inverter circuit 17 are input to the two inputs of the AND circuit 18. Further, an output signal of the AND circuit 18 is supplied the gate of the fourth NMOS transistor N4, and the inversion signal $\overline{SEN}$ obtained by inverting the sense amplifier enable signal SEN by the inverter circuit 15 is supplied 7 to the gate of the PMOS transistor P1.

The test control circuit 14a is provided so as to control the driving signal for the N-channel sense amplifier used for carrying out the function test of the refresh counter and the counter cycle of the self-refresh, and is designed to pull up the output node of the N-channel sense amplifier driving signal of the sense amplifier driving circuit to the power potential at the test mode. More specifically, the test control circuit 14a includes the second PMOS transistor P2 connected between the point of connection of the first and third NMOS transistors in series (the output node of the N-channel sense amplifier driving signal) and a Vcc node, and controlled to be in an OFF state when the normal operation mode is "active" or to be in an OFF state when the test mode is "active". In this embodiment, the test control circuit 14a further includes a NAND circuit 20 having two inputs, to which the sense amplifier enable signal SEN and the test mode entry signal TEST are input. An output signal of the NAND circuit 20 is supplied to the gate of the second PMOS transistor P2. Thus, with the DRAM of the second embodiment, the operation illustrated in FIG. 4 can be performed and therefore the operational effects similar to those of the DRAM and the testing method of the first embodiment, can be obtained.

As described, according to the present invention, there is provided a DRAM capable of performing the function test of the refresh counter and the measurement of the counter cycle at the time of self-refresh, accurately in a short period of time, and testing method thereof. Thus, a DRAM device which does not occupy a large area within the device, can be realized at a low production cost.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A dynamic semiconductor memory device comprising:

a counter for generating a row address for carrying out a refresh operation in accordance with an auto-refresh mode and a self-refresh mode;

memory cells arranged in matrix;

word lines connected to memory cells located in a same column;

bit lines connected to memory cells in a same row, said bit lines being provided in pair to be complimentary to each other;

a precharge equalizing circuit connected to the complimentary bit line pair;

a bit line sense amplifying circuit including a first conductivity type sense amplifier and a second conductivity type sense amplifier, connected to the bit line pair;

a sense amplifier driving circuit for supplying respective driving signals of the first conductivity type sense amplifier and the second conductivity type sense amplifier; and a test control circuit for controlling an operation of the sense amplifier driving circuit, in order to carry out the function test of the counter and the measurement of the counter cycle at the time of the refresh operation, the test control circuit controlling the driving signals so as to set one of the first conductivity type sense amplifier and the second conductivity type sense amplifier in a non-active state at the time of a test mode.

2. A dynamic semiconductor memory device comprising:

a counter for generating a row address for carrying out a refresh operation in accordance with an auto-refresh mode and a self-refresh mode;

memory cells arranged in matrix;

word lines connected to memory cells located in a same column;

bit lines connected to memory cells in a same row, said bit lines being provided in pair to be complimentary to each other;

a precharge equalizing circuit connected to the complimentary bit line pair;

a bit line sense amplifier, connected to the bit line pair, including an N-channel sense amplifier for detecting a potential difference between bit lines and a P-channel sense amplifier for restoring a bit line potential;

a sense amplifier driving circuit for supplying respective driving signals of the N-channel sense amplifier and the P-channel sense amplifier; and a test control circuit, provided to control the driving signal of the P-channel sense amplifier in order to carry out the function test of the counter and the measurement of the counter cycle at the time of the refresh operation, for pulling down an output node of the driving signal of the P-channel sense amplifier in the sense amplifier driving circuit, to a ground potential at the time of a test mode.

3. A dynamic semiconductor memory device according to claim 2, wherein said sense amplifier driving circuit further comprises: first and second N-channel MOS transistors each having a current path, to one end of which a voltage power for precharging said bit lines, is connected, and each having a gate to which an equalizing signal is supplied; a third N-channel MOS transistor, a current path of which is connected between other ends of the current paths of said first and second N-channel MOS transistors, said third N-channel MOS transistor having a gate to which said equalizing signal is supplied; a fourth N-channel MOS transistor connected between the point of connection of said first and third NMOS transistors in series and a ground potential node, and controlled to be in an ON state when the normal operation mode, other than the test mode, is "active" or when the test mode is "active"; and a P-channel MOS transistor, connected between the point of connection of the second and third NMOS transistors in series and a power potential node, and controlled to be in an ON state when the normal operation mode is "active" and to in an OFF state when the test mode is "active"; and said test control circuit further comprises a fifth NMOS transistor connected between the point of connection of the second and third NMOS transistors in series and a ground potential node, and controlled to be in an OFF state when the normal operation mode is "active" or to be in an ON state when the test mode is "active".

4. A dynamic semiconductor memory device according to claim 2, wherein said sense amplifier driving circuit further comprises: first and second N-channel MOS transistors each having one end to which a voltage power for precharging said bit lines, is connected, and each having a gate to which an equalizing signal is supplied; a third N-channel MOS transistor, connected between other ends of the current paths of said first and second N-channel MOS transistors, said third N-channel MOS transistor having a gate to which said equalizing signal is supplied; a fourth N-channel MOS transistor connected between the point of connection of said first and third NMOS transistors in series and a ground potential node, and having a gate to which a sense amplifier enable signal is supplied; an OR circuit having two inputs to which an inversion signal of the sense amplifier enable signal, and a test mode entry signal are input; a P-channel MOS transistor having a gate to which an output signal of said OR circuit is supplied, and a fifth N-channel MOS transistor connected between the P-channel MOS transistor and the ground potential node; and said test control circuit further comprises an AND circuit having two inputs to which said sense amplifier enable signal or a signal having a same phase as that of said sense amplifier enable signal, and said test mode entry signal, and supplying an output to the gate of said fifth N-channel MOS transistor.

5. A dynamic semiconductor memory device comprising:

a counter for generating a row address for carrying out a refresh operation in accordance with an auto-refresh mode and a self-refresh mode;

memory cells arranged in matrix;

word lines connected to memory cells located in a same column;

bit lines connected to memory cells in a same row, said bit lines being provided in pair to be complimentary to each other;

a precharge equalizing circuit connected to the complimentary bit line pair;

a bit line sense amplifier, connected to the bit line pair, including an N-channel sense amplifier for detecting a potential difference between bit lines and a P-channel sense amplifier for restoring a bit line potential;

a sense amplifier driving circuit for supplying respective driving signals of the N-channel sense amplifier and the P-channel sense amplifier; and a test control circuit, provided to control the driving signal of the P-channel sense amplifier in order to carry out the function test of the counter and the measurement of the counter cycle at the time of the refresh operation, for pulling up an output node of the driving signal of the N-channel sense amplifier in the sense amplifier driving circuit, to a power potential at the time of a test mode.

6. A dynamic semiconductor memory device according to claim 5, wherein said sense amplifier driving circuit further comprises: first and second N-channel MOS transistors each having a current path, to one end of which a voltage power for precharging said bit lines, is connected, and each having a gate to which an equalizing signal is supplied; a third N-channel MOS transistor, a current path of which is connected between other ends of the current paths of said first and second N-channel MOS transistors, said third N-channel MOS transistor having a gate to which said equalizing signal is supplied; a fourth N-channel MOS transistor connected between the point of connection of said first and third NMOS transistors in series and a ground potential node, and controlled to be in an ON state when the normal operation mode, other than the test mode, is "active" and to be in an OFF state when the test mode is "active"; and a first P-channel MOS transistor, connected between the point of connection of the second and third NMOS transistors in series and a power potential node, and controlled to be in an ON state when the normal operation mode is "active" or when the test mode is "active"; and said test control circuit further comprises a second P-channel MOS transistor connected between the point of connection of the first and third N-channel MOS transistors in series and said power potential node, and controlled to be in an OFF state when the normal operation mode is "active" or to be in an ON state when the test mode is "active".

7. A dynamic semiconductor memory device according to claim 5, wherein said sense amplifier driving circuit further comprises: first and second N-channel MOS transistors each having a current path, to one end of which a voltage power for precharging said bit lines, is connected, and each having a gate to which an equalizing signal is supplied; a third N-channel MOS transistor, a current path of which is connected between other ends of the current paths of said first and second N-channel MOS transistors, said third N-channel MOS transistor having a gate to which said equalizing signal is supplied; a fourth N-channel MOS transistor connected between the point of connection of said first and third NMOS transistors in series and a ground potential node, and controlled to be in an ON state when the normal operation mode, other than the test mode, is "active" and to be in an OFF state when the test mode is "active"; and a first P-channel MOS transistor, connected between the point of connection of the second and third N-channel MOS transistors in series and a power potential node, and having a gate to which an inversion signal to a sense amplifier enable signal is supplied; an AND circuit having two inputs to which the sense amplifier enable signal and an inversion signal to a test mode entry signal are input; a fourth NMOS transistor having a gate to which an output signal of said AND circuit is supplied, and a second P-channel MOS transistor connected between the point of connected of the first and third N-channel MOS transistors in series and the power potential node; and said test control circuit further comprises a NAND circuit having two inputs to which said sense amplifier enable signal and said test mode entry signal, and supplying an output to the gate of said second P-channel MOS transistor.

8. A method of testing a dynamic semiconductor memory device comprising:

a counter for generating a row address for carrying out a refresh operation in accordance with an auto-refresh mode and a self-refresh mode;

memory cells arranged in matrix;

word lines connected to memory cells located in a same column;

bit lines connected to memory cells in a same row, said bit lines being provided in pair to be complimentary to each other;

a precharge equalizing circuit connected to the complimentary bit line pair;

a first conductivity type sense amplifier and a second conductivity type sense amplifier, connected to the bit line pair;

a sense amplifier driving circuit for supplying respective driving signals of the first conductivity type sense amplifier and the second conductivity type sense amplifier; and a row decoder for decoding the row address generated from said counter and selectively driving said word lines;

said method comprising:
the first step of writing data of a predetermined level to memory cells of all the rows;
the second step of controlling the second conductivity type sense amplifier in a non-active state and only the first conductivity type sense amplifier is an active state, and consecutively selecting all the word lines;
the third step of consecutively reading out data of the memory cell on all the rows; and
the fourth step of detecting whether or not there is an erroneous operation of the address counter from the comparison between the write data in the first step and the read data in the third step.

9. A method of testing the memory device, according to claim 8, wherein the cycle of the counting operation of the counter is obtained from the bit number detected in the case where it is judged that there is an erroneous operation.

* * * * *